(12) United States Patent
Pohlman et al.

(10) Patent No.: US 6,819,537 B2
(45) Date of Patent: Nov. 16, 2004

(54) POWER REGULATION SYSTEM, APPARATUS, AND METHOD FOR PROVIDING REGULATED POWER TO A MICROELECTRONIC DEVICE

(75) Inventors: William Pohlman, Phoenix, AZ (US); Robert Carroll, Andover, MA (US); David Susak, Phoenix, AZ (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/104,039

(22) Filed: Mar. 22, 2002

(65) Prior Publication Data

US 2003/0015996 A1 Jan. 23, 2003

Related U.S. Application Data

(60) Provisional application No. 60/343,941, filed on Dec. 26, 2001, and provisional application No. 60/277,839, filed on Mar. 22, 2001.

(51) Int. Cl.[7] .............................. H02H 3/00; G11C 7/00
(52) U.S. Cl. ......................... 361/64; 361/93.1; 365/226
(58) Field of Search ................................ 323/225, 226, 323/272, 273, 274, 271, 276, 284; 361/111, 18, 92, 54, 58; 365/226, 227, 228, 189; 363/71, 80, 89, 37, 41, 40

(56) References Cited

U.S. PATENT DOCUMENTS

| | | | |
|---|---|---|---|
| 3,675,114 A | | 7/1972 | Nercessian |
| 4,356,542 A | * | 10/1982 | Bruckner et al. .............. 363/26 |
| 4,675,770 A | | 6/1987 | Johansson |
| 5,455,501 A | | 10/1995 | Massie |
| 5,563,838 A | | 10/1996 | Mart et al. |
| 5,574,697 A | * | 11/1996 | Manning .................... 365/226 |
| 5,629,608 A | | 5/1997 | Budelman |
| 5,717,319 A | | 2/1998 | Jokinen |
| 5,777,383 A | | 7/1998 | Stager et al. |
| 5,787,014 A | * | 7/1998 | Hall et al. ................... 323/312 |
| 5,822,166 A | | 10/1998 | Massie |
| 5,835,979 A | | 11/1998 | Hiraki et al. |
| 5,864,225 A | | 1/1999 | Bryson |
| 5,877,611 A | | 3/1999 | Brkovic |
| 5,914,873 A | | 6/1999 | Blish, II |
| 5,938,769 A | | 8/1999 | Hu |
| 5,945,941 A | | 8/1999 | Rich, III et al. |
| 5,952,733 A | * | 9/1999 | Johnston ....................... 307/44 |
| 6,429,630 B2 | * | 8/2002 | Pohlman et al. ............. 323/272 |

FOREIGN PATENT DOCUMENTS

EP 0 922 636 A1 6/1999

OTHER PUBLICATIONS

Amoroso, L. et al.; "Single Shot Transient Suppressor (SSTS) for High Current High Slew Rate Microprocessor"; Applied Power Electronics Conference and Exposition, 1999; Mar. 14–18, 1999; pp. 284–288.

PCT International Search Report; PCT/US02/08906; Mailed Oct. 4, 2002; 4 pgs.

* cited by examiner

*Primary Examiner*—Rajnikant B. Patel
(74) *Attorney, Agent, or Firm*—Theodore E. Galanthay

(57) ABSTRACT

A method, apparatus, and system for providing operating power and transient suppression power to a microelectronic device are disclosed. The system includes a primary regulator to supply nominal operating power and to respond to relatively slow transient events and a transient suppression regulator to respond to fast transient power events. The system also includes a sense circuit to detect when a transient event occurs and to send a signal to the transient suppression regulator to supply or sink current to the load in response to a sensed transient power event.

22 Claims, 4 Drawing Sheets

POWER REGULATION SYSTEM, APPARATUS, AND METHOD FOR PROVIDING REGULATED POWER TO A MICROELECTRONIC DEVICE

CROSS REFERENCE TO RELATED APPLICATIONS

This Application claims priority to Provisional Application Ser. No. 60/277,839, entitled "INDEPENDENT VOLTAGE DOMAIN CONTROL APPARATUS AND TECHNIQUES", filed Mar. 22, 2001; to Provisional Application Ser. No. 60/343,941 entitled "FINE GRAIN POWER DELIVERY SYSTEM FOR MICROELECTRONIC DEVICES", filed Dec. 26, 2001 and to Application Ser. No. 09/771,756, entitled "APPARATUS FOR PROVIDING REGULATED POWER TO AN INTEGRATED CIRCUIT", filed Jan. 29, 2001, now U.S. Pat. No. 6,429,630, issued on Aug. 6, 2002.

FIELD OF THE INVENTION

The present invention generally relates to microelectronic power regulation systems. More particularly, the invention relates to a tiered power regulation system configured to supply high speed, high current power to a microelectronic device.

BACKGROUND OF THE INVENTION

Microelectronic power regulation systems generally include a power regulator configured to supply a desired, regulated power to a microelectronic device such as microprocessors. The system may also include capacitors located near and/or packaged with the microprocessor to supply additional charge during the operation of the microprocessor. Such power regulation systems are configured so that the power regulator (e.g., a switching regulator such as a Buck regulator) provides nominal operating power to the microprocessor and the capacitors supply charge to compensate for transient power demands that result from operation of the microelectronic device. Such transient power demands may occur, for example, when several transistors of the microprocessor switch in the same direction at approximately the same time—e.g., when a portion of the device is powered off to conserve power or a portion of the device is activated.

As the speed and integration of microprocessors increase, the use of power regulation systems that only employ decoupling capacitors to compensate for or regulate transient power demands becomes increasingly problematic. In particular, the number and/or size of the capacitors required to account for transient events generally increases as the integration of the microprocessor increases. The capacitors take up a relatively large amount of space on the package and can be relatively expensive. In addition, as the speed and the performance of the microprocessor increases, the severity (e.g., the amplitude) of the transient power demands and the frequency of the events tend to increase. Capacitors within typical power regulation systems may be unable to adequately regulate such sever transient power demands. If not properly regulated, the transient power demands may cause noise on the power supply and induce errors during operation of the microprocessor. Accordingly, improved apparatus for responding to transient events that result during operation of a microprocessor are desired.

Furthermore, although typical Buck regulators are generally suitable for controlling power to some microprocessors, such regulators are not well suited to supply relatively high current (e.g., greater than about 30 amps) at relatively high speed (e.g., greater than about 500 MHz). One reason that Buck regulators have difficulty supplying high current at high speed to the microprocessor is that the regulator is configured to supply a single core operating voltage (Vcc) to the entire microprocessor. Supplying power from a single source and distributing the power to a limited number of locations of the microprocessor may be problematic in several regards. For example, various portions of the microprocessor may operate more efficiently at different amounts of power—e.g. at different current and/or voltage levels. To compensate for the different power requirements, the microprocessor may require additional components and integration to step the power up or down as needed. Such additional components and integration may undesirably add to the cost and complexity of the microprocessor and systems including the microprocessor. Further, supplying all or most of the power from a single regulated power source requires a relatively large power regulator, which is generally inherently slow to respond to changes in power demands.

Another problem associated with supplying the same power to a limited number of locations of a microprocessor is that microprocessor wiring schemes configured to distribute the regulator power to the microprocessor are generally complex and include relatively long wiring sections to supply power to sections of the device located away from the input source of the power. The relatively long wiring sections may cause delay and undesirable signal degradation or loss of the transmitted power. Accordingly, improved methods and apparatus for providing power to a plurality of portions of a microelectronic device and to supply various amounts of power to a plurality of locations on the microprocessor are desired.

SUMMARY OF THE INVENTION

The present invention provides improved apparatus and techniques for regulating power to a microelectronic device. More particularly, the invention provides improved devices and methods suitable for supplying electronic devices with relatively high, regulated current at relatively high speed.

The way in which the present invention addresses the deficiencies of now-known regulators and power supply systems is discussed in greater detail below. However, in general, the present invention provides a power regulation system suitable for providing different power to a plurality of portions of a microelectronic device.

In accordance with one exemplary embodiment of the present invention, a power regulation system in accordance with the present invention includes a primary regulator configured to supply power and low-frequency transient suppression power to a plurality of locations on a microelectronic device. In accordance with one aspect of this embodiment, the power regulation system also includes a plurality of secondary or transient suppression regulators coupled to the primary regulator and the microelectronic device and configured to respond to or account for high-frequency transient power demands. In accordance with a further aspect of this embodiment, a secondary voltage regulator is configured in closed loop such that accurate voltage control may be obtained. In accordance with another aspect of the invention, a secondary regulators are configured in an open loop to quickly respond to the transient event. In accordance with another aspect of the invention, at least one secondary regulator includes both an open loop portion and a closed loop portion. In accordance with yet a further aspect of this embodiment, the power regulation system includes a controller coupled to the primary regulator to drive the primary regulator and adjust the operation of the primary regulator in response to or in anticipation of a transient power event.

In accordance with another embodiment of the invention, a power regulation system includes a plurality of primary regulators, wherein each primary regulator is coupled to a different portion of a microelectronic device. In accordance with one aspect of this embodiment, two or more of the plurality of regulators are configured to provide different levels of power to the different portions of the microelectronic device. In accordance with one aspect of this embodiment, the power regulation system also includes at least one transient suppression regulator coupled to at least one of the primary regulators and the microelectronic device. In accordance various aspects of the invention, the secondary regulators are configured in an open loop and/or closed loop topology. In accordance with yet a further aspect of this embodiment, the power regulation system includes a controller, configured to receive a signal indicative of a transient event, coupled to the primary regulator, such that the controller drives the primary regulator in response to the transient event.

BRIEF DESCRIPTION OF THE DRAWINGS

A more complete understanding of the present invention may be derived by referring to the detailed description, considered in connection with the figures, wherein like reference numbers refer to similar elements throughout the figures, and.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention generally relates to microelectronic power regulators. More particularly, the invention relates to a power regulation apparatus, systems, and methods for providing high current, high speed power to microelectronic devices and suppression of transient power demands produced by the microelectronic device. Although the present invention may be used to provide power to a variety of microelectronic devices, the invention is conveniently described below in connection with providing power to microprocessors.

Figure 1:
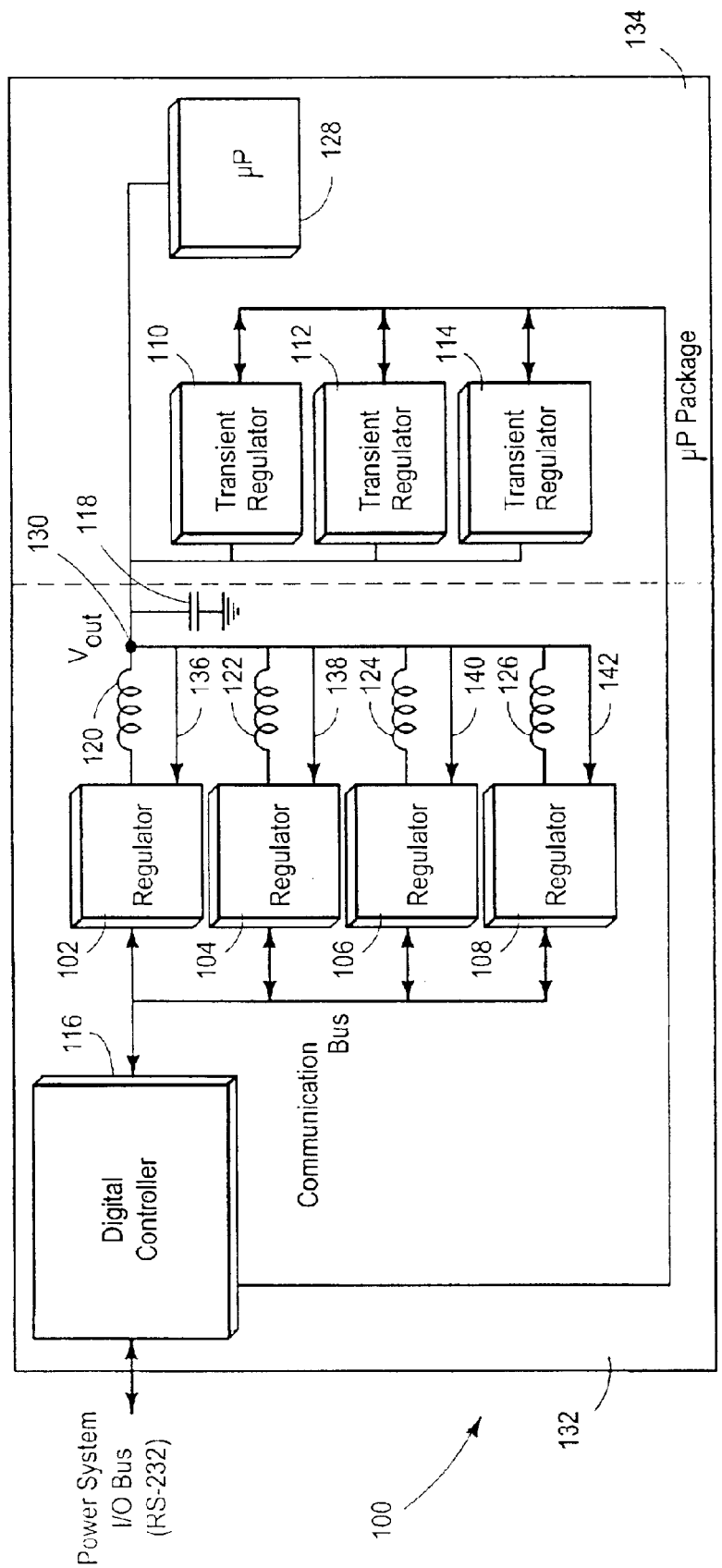
FIG. 1 is an illustration of a power regulation system in accordance with an exemplary embodiment of the present invention.

FIG. 1 illustrates a power regulation system 100 in accordance with one exemplary embodiment of the invention. System 100 includes primary power regulators 102–108, transient suppression regulators 110–114, and a controller 116. System 100 may also suitably include one or more capacitors 118 and one or more inductors 120–126 coupled to a load 128. Although exemplary system 100 is illustrated with four primary regulators 102–108, three transient regulators 110–114, four inductors 120–126, and one capacitor, power regulation systems in accordance with the present invention may include any suitable number of primary regulators, transient suppression regulators, inductors, and capacitors. Furthermore, power regulation systems in accordance with the present invention may include additional components, such as resistors, transistors, additional capacitors and/or inductors, and the like, which are not illustrated in the drawing figures.

In operation, system 100 provides operating power to a microprocessor 128 and also responds to transient events caused by the operation of microprocessor, e.g., a power surge due to, for example, multiple gates with the microprocessor switching in the same direction at about the same time or from a portion of the microprocessor is powering up or down. More specifically, operating power and low-frequency (e.g., less than about 100 KHz) transient suppression power is supplied to microprocessor via regulators 102–108 and transient suppression regulators 110–114 supply high-frequency (e.g., greater than about 100 KHz) transient suppression power to the power supply circuit. As discussed in more detail below, regulators 102–108 may be configured to alter operation to respond to actual or predicted transient events and transient suppression regulators 110–114 may be configured to supply power in response to actual or predicted transient power demands from the microprocessor, such that any spikes or droops that would otherwise occur on the power circuit are reduced or eliminated.

As noted above, primary regulators 102–108 are configured to provide nominal operating power to microprocessor 128 and to provide low frequency transient suppression. Byway of particular example, regulators 102–108 maybe configured to provide about 1.1 volts±about ten percent at about 100 amps±ten percent to microprocessor 128 and respond to transient events occurring at less than about 100 KHz. However, regulators having other output voltages and current levels are within the scope of the present invention.

Regulators 102–108 may be configured in a variety of ways, such as, for example, a linear regulator, or a single or multi-phase switching regulator. In accordance with one exemplary embodiment of the invention, regulators 102–108 are three or four phase switching regulators tied to a common voltage node 130, through inductors 120–126. In accordance with alternate embodiments of the invention, regulators 102–108 may be replaced with a single multi-phase switching regulator. An exemplary primary regulator suitable for use with the present invention is described in greater detail in application Ser. No. 09/975,195, entitled SYSTEM AND METHOD FOR HIGHLY PHASED POWER REGULATION, filed Oct. 10, 2001, the contents of which are hereby incorporated herein by reference. Regulators 102–108 may be formed on a single substrate as part of an array or on separate substrates as discrete components. In either case, regulators 102–108 maybe coupled to another substrate (e.g., a substrate 132), such as a motherboard or an interposer. In addition, regulators 102–108 may suitably include feedback loops, represented by lines 136–142, to facilitate accurate control of the voltage at node 130. In accordance with one aspect of this embodiment, regulators 102–108 form an array configured to provide about 15 amps or more of power at about 1 MHz switching speed.

Transient regulators 110–114 may also be configured in a variety of ways in accordance with various embodiments of the invention. In general, regulators 110–114 are configured to quickly respond to fast, high frequency power demands. In other words, secondary regulators 110–114 are configured to reduce power spikes or droops in system 100 by providing or sinking power in response to transient power events. In accordance with one aspect of this embodiment regulators 110–114 are configured to sink and/or source current in response to a signal indicative of a transient response. In accordance with other aspects of this embodiment each transient regulator 110–114 is configured to independently respond to transient events that occur at one or more portions of microprocessor 128.

Figure 2:
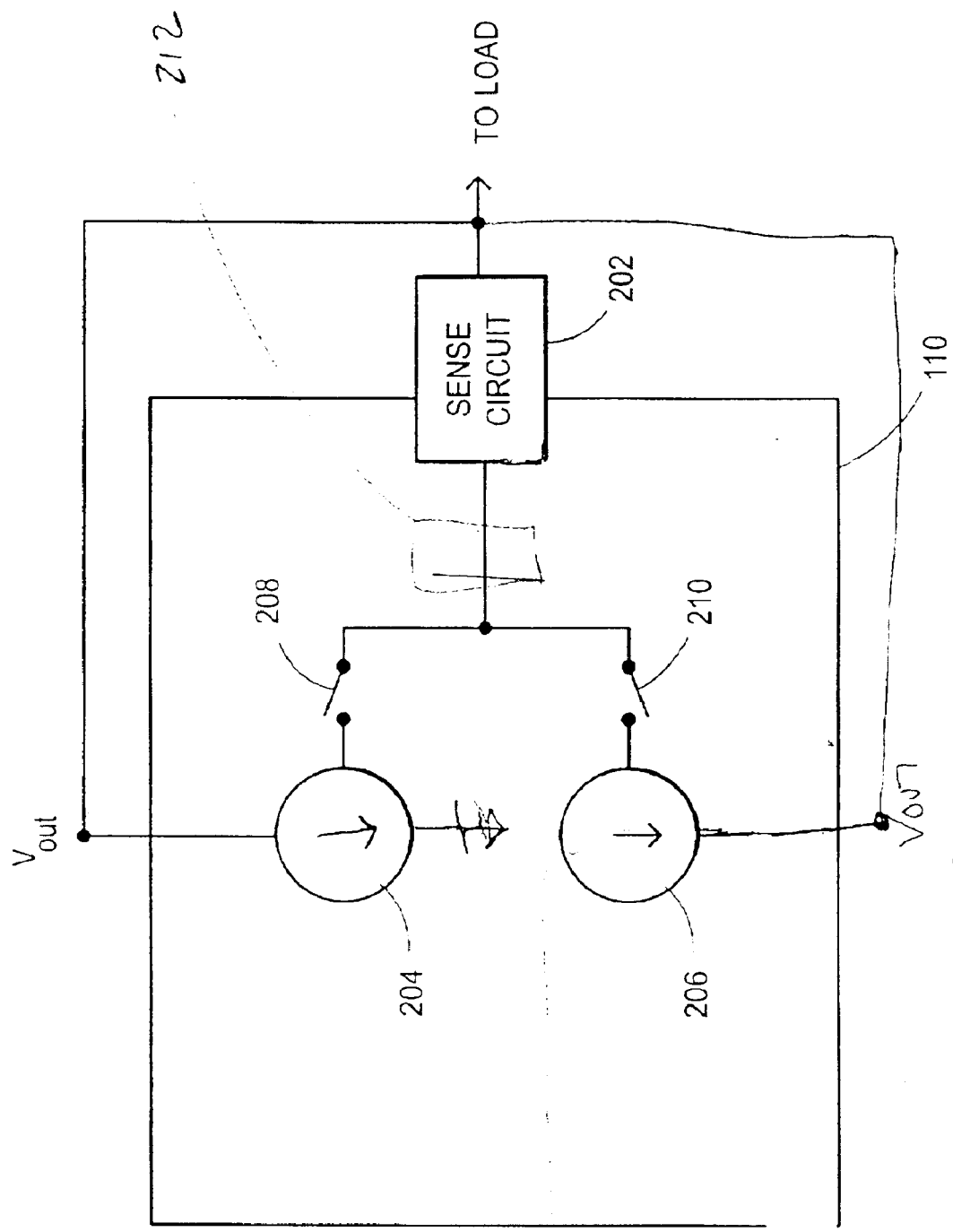
FIG. 2 is an illustration of an exemplary transient suppression regulator including a sense circuit in accordance with the present invention.

FIG. 2 schematically illustrates a transient power regulator (e.g., regulator 110) in greater detail. In accordance with this embodiment, transient regulator 110 includes a sense circuit 202, a current source 204, a current sink 206, switches 208 and 210, and a controller. In operation, a change in power is detected at circuit 202, which sends a corresponding signal to controller 212, which sends a corresponding signal to switches 208 or 210 to short the appropriate portion of the circuit and consequently sink or supply charge in response to the sensed transient power demand.

Sense circuit 202 may be configured in a variety of ways in accordance with various embodiments of the invention. For example, sense circuit may be configured to sense a change in current, a rate of change of current, a change in voltage, a rate of change of voltage, or any combination thereof Although illustrated as part of a transient regulator 110, sense circuit 202 maybe a discrete component, formed as part of a primary regulator, or formed as an integral part of microprocessor 128. Further, one sense circuit maybe used to provide a signal to multiple regulators 110–114. More detailed descriptions of exemplary sense circuits suitable for use in connection with the present invention are described in application Ser. No. 09/945,187, entitled APPARATUS AND SYSTEM FOR PROVIDING TRANSIENT SUPPRESSION POWER REGULATION, filed Aug. 31, 2001 and application Ser. No. 60/361,976, entitled METHOD AND APPARATUS FOR CLOSED LOOP MULTISENSING TRANSIENT POWER REGULATION, filed Mar. 6, 2002, the contents of which are herein incorporated by reference.

Charge sources 204, 206 and switches 208, 210 may also be formed in a variety of configurations. For example, switches 208 and 210 may be formed using transistors (e.g., field effect or bipolar transistors), and charge sources 204, 206 may be formed using additional transistors. Exemplary circuits suitable for use as transient suppression regulators, which may also include a sense circuit, are described in greater detail in the '187 application; in application Ser. No. 10/104833, entitled METHOD AND APPARATUS FOR OPEN LOOP CONTROL OF POWER SUPPLY TRANSIENTS, filed Mar. 21, 2002.

In accordance with an exemplary embodiment of the present invention, digital controller 116 is configured to drive one or more regulators 102–108. Controller 116 may be further configured to receive a signal from circuit 202 and send information to one or more regulators 102–108 based on the received signal. By way of example, circuit 202 may send a signal, indicating that a transient event has been detected, to controller 116. In this case, controller 116 in turn sends a signal to one or more primary regulators 102–108 to cause the regulators to alter output in response (e.g., to change operating mode to provide current to the microprocessor at a higher rate) to the sensed transient event. Controller 116 may also be configured to provide protection against excessive currents, excessive transient response activity, faults, and the like.

Controller 116 may be configured as an analog or digital controller. In accordance with one exemplary embodiment of the invention, controller 116 is a digital controller, which includes system monitoring devices. A more detailed description of a controller suitable for use with the present invention is described in application Ser. No. 10/103980, entitled SYSTEM AND METHOD TO MAINTAIN VOLTAGE REGULATION DURING RAPID LOAD CHANGES IN VOLTAGE REGULATOR MODULES, filed Mar. 22, 2002.

Figure 3:
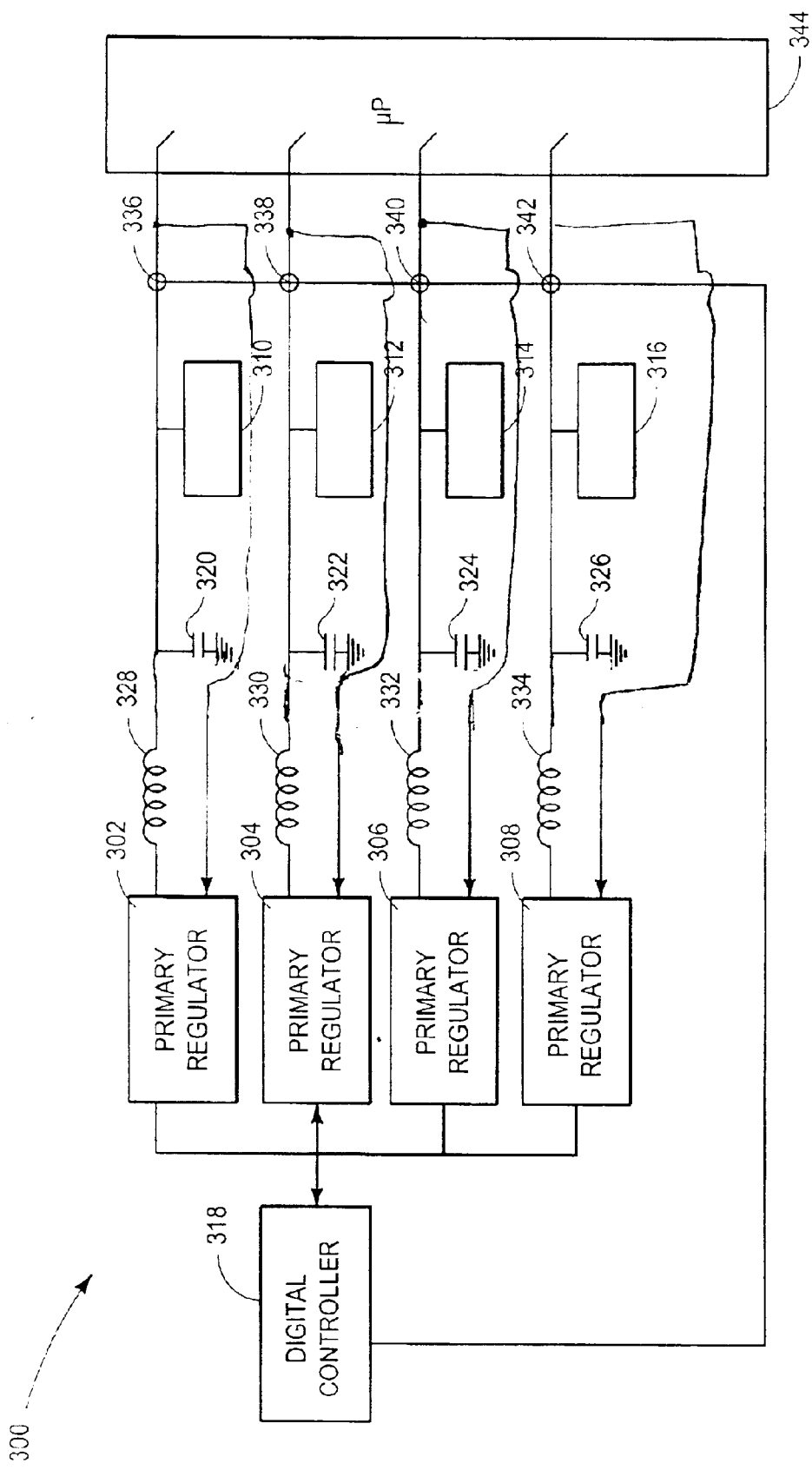
FIG. 3 is an illustration of a power regulation system in accordance with an alternate embodiment of the invention.

FIG. 3 illustrates a power regulation system 300 in accordance with another exemplary embodiment of the invention. System 300 includes primary regulators 302–308, transient suppression regulators 310–316, a controller 318, capacitors 320–326, inductors 328–334, and sense circuits 336–342, coupled to a microprocessor 344. System 300 is similar to system 100, except system 300 is configured to supply independently controlled operating power to a plurality of locations on microprocessor 344. In accordance with various aspects of this embodiment, each primary regulator 302–308 is configured to provide independently controlled power to an independent or isolated portion of microprocessor 344. An independent portion of microprocessor 344 may include, for example, a group of related processor units for power delivery purposes (e.g., floating point unit memory unit, input/output unit, or the like) separated from other units or portions using suitable dielectric material and power grid formation techniques. Alternatively or in addition to providing power to various units of the microprocessor, the microprocessor may be divided into spacial portions, and power may be independently supplied to the spatial portions of the microprocessor using a plurality of regulators 302–308. By providing power to various units and/or portions of the microprocessor, system 300 is able to quickly respond to changes in power demands, e.g., to transient events, and system 300 maybe configured to tailor supplied power according to the operation of portions and/or units of the microprocessor, rather than supplying one operating voltage to the entire microprocessor. In addition, each regulator 302–308 may be independently powered up or down, depending on operating conditions of a portion of the microprocessor, rather than based on operating conditions of the entire microprocessor.

Power regulators 302–308 may be configured as any of regulators 102–108 described above. In accordance with one embodiment of the invention, regulators 302–308 are switching regulators and at least one of regulators 302 is a multi-phase switching regulator. In accordance with one aspect of this embodiment, one or more regulators 302–308 are configured such that the output of at least one of the regulators differs from the output of other regulators, such that power supplied to one portion of microprocessor 344 differs from power supplied to another portion of the microprocessor.

Similarly, transient suppression regulators 310–316 may include any combination of the transient suppression regulators 110–114 described above in connection with FIG. 1. In accordance with one embodiment of the invention, each regulator 302–308 is coupled in parallel with a corresponding transient regulator 310–316. However, in accordance with other embodiments of the invention, one or more regulators 302–308 may not be coupled to a transient suppression regulator and one or more regulators 302–308 may be coupled, in parallel, to a plurality of transient regulators. In accordance with other embodiments of the invention, one or more transient suppression regulators may be power by yet another power source such as an unregulated power supply (e.g., an alternating current/direct current converter).

Sense circuits 336–342 may comprise any one or more of the sense circuits described above in connection with sense circuit 202, illustrated in FIG. 2. In accordance with one exemplary embodiment, at least one sense circuit 336–342 includes a di/dt sense circuit configured to quickly detect a transient event and send a corresponding signal to one or more transient suppression regulator 310–316 and optionally to controller 318. Although illustrated with four sense circuits, power regulation systems in accordance with the present invention may include any desired number and any desired combination of configurations of sense circuits. For example, a system may include only one sense circuit that communicates with a plurality of transient suppression regulators and optionally to a controller.

In accordance with an alternate embodiment of the invention, microprocessor 344 may be configured to supply a predictive signal indicative of occurrence of a likely transient event. A microelectronic device and system including a device with a predictive signal generator is described in detail in application Ser. No. 10/104227 entitled METHOD, APPARATUS & SYSTEM FOR PREDICTIVE POWER REGULATION TO A MICROELECTRONIC CIRCUIT and filed Mar. 21, 2002, the contents of which are hereby incorporated by reference.

Similar to controller 116, controller 310 is generally configured to drive one or more regulators 302–308. Further, controller 310 maybe configured to receive a signal from one or more sense circuits 336–342 and send a corresponding signal to one or more primary regulators 302–308 to cause one or more of the regulators to temporarily alter an operating condition in response to the sensed transient event. Controller 318 may be further configured to power up, power down, or alter operating parameters such as duty cycle and the like of one or more regulators 302–308 in response to a sensed operating conditions or other suitable signal.

Figure 4:
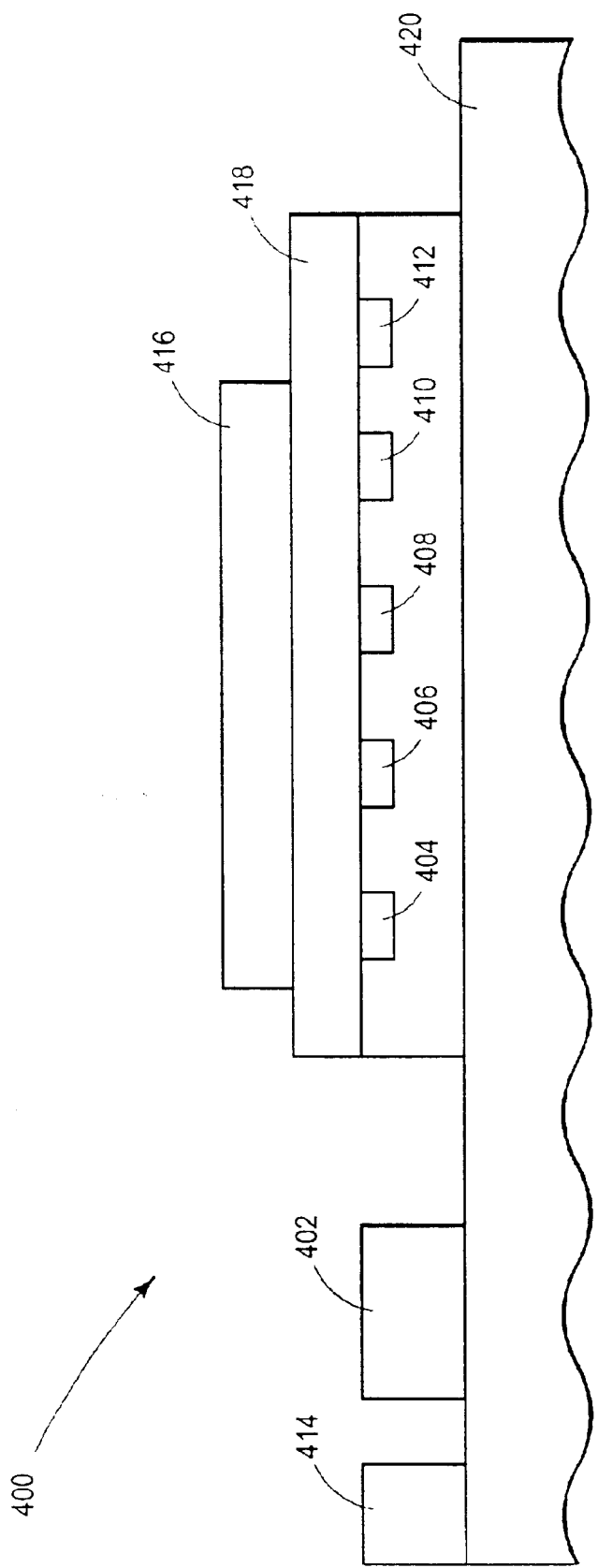
FIG. 4 is a cross-sectional illustration of a power regulation system in accordance with a further exemplary embodiment of the invention.

FIG. 4 schematically illustrates a power regulation system 400, including a primary regulator 402, a plurality of transient suppression regulators 404–412, and a controller 414 coupled to a microprocessor 416. In accordance with the exemplary illustrated embodiment, transient suppression regulators 404–412 are coupled (e.g., using bump technology) to a substrate 418 such multi-layered fire-resistant printed circuit board, to which microprocessor 416 is also coupled (e.g., using bump technology). In accordance with other embodiments of the invention, regulators 404–412 may be attached to the microprocessor using Bumpless Build-Up Layer (BBUL) technology. In accordance with yet another embodiment of the invention, regulators 402 and 404–412 may be packaged together and coupled either directly or indirectly to the microprocessor.

In further accordance with embodiment illustrated in FIG. 4, primary regulator 402 is coupled to a second substrate 420 such as another printed circuit board (e.g., a mother board of a computer system) and is coupled to microprocessor 416 and to at least one of regulators 404–412. Alternatively, regulators 404–412 may be coupled to another power source. Forming or attaching regulator 402 to a second substrate may be advantageous because any heat generated by the regulator may be more easily dissipated and is less likely to affect performance of microprocessor 416. Although illustrated as a separate component, controller 414 (or controllers 116, 318) may suitably be integrated with any of microprocessor 416, secondary regulators 404–412, or primary regulator 402. In accordance with one exemplary embodiment of the invention, controller 414 is a discrete circuit coupled to primary regulator 402 and a sense circuit (not illustrated, which may be formed as part of any of regulators 404–412 as described above) and/or to microprocessor 414 using conductive layers on or within substrate 420.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in the power regulation systems of the present invention.

The present invention has been described above with reference to exemplary embodiments. Those skilled in the art having read this disclosure will recognize that changes and modifications may be made to the embodiments without departing from the scope of the present invention. For instance, the present invention has been described in connection with coupling various components to printed circuit board substrates; however various other substrates and packages may be used to couple the components. These and other changes or modifications are intended to be included within the scope of the present invention, as expressed in the following claims.

We claim:

1. A power regulation system for providing power to a microelectronic device, the system comprising:
   a plurality of first power regulators configured to provide nominal operating power to a plurality of locations on a microelectronic device and to respond to low frequency transient power demands by the microelectronic device; and
   a plurality of second power regulators configured to provide transient suppression power to the microelectronic device in the event of a high frequency transient power requirement,
   wherein at least one of the second regulators is coupled in parallel to at least one of the fist power regulators.

2. The power regulation system of claim 1, wherein the plurality of first power regulators is configured to supply power to a plurality of locations on the microelectronic device.

3. The power regulation system of claim 1, wherein the plurality of first power regulators is configured to supply power at a plurality of voltages to a plurality of locations on the microelectronic device.

4. The power regulation system of claim 1, further comprising a controller coupled to at least one of the plurality of first power regulators.

5. The power regulation system of claim 1, further comprising a sense circuit configured to detect a change in power demanded by the microelectronic device.

6. The power regulation system of claim 5, wherein the sense circuit includes a change of current with respect to time detection circuit.

7. The power regulation system of claim 5, wherein the sense circuit includes a change voltage detection circuit.

8. The power regulation system of claim 5, further comprising a controller coupled to the sense circuit, wherein the controller is configured to receive a first signal indicative of a sensed transient power event and to send a second signal to at least one of the plurality of first power regulators.

9. The power regulation system of claim 1, wherein at least one of the plurality of first power regulators comprises a multi-phase switching regulator.

10. The power regulation system of claim 1, further comprising a first substrate coupled to at least one of the plurality of second regulators and to the microelectronic device.

11. The power regulation system of claim 1, further comprising a second substrate coupled to the first substrate and to at least one of the plurality of first power regulators.

12. The power regulation system of claim 1, wherein at least one of the plurality of second power regulators comprises an open loop transient suppression portion.

13. The power regulation system of claim 1, wherein at least one of the plurality of second power regulators comprises a closed loop transient suppression portion.

14. The power regulation system of claim 13, wherein at least one of the plurality of second power regulators comprises a combination of an open loop transient suppression portion and a closed loop transient suppression portion.

15. A microelectronic power regulation system comprising:
   a primary power regulator configured to provide nominal operating power to a microelectronic device and to respond to low frequency transient events; and
   a plurality of transient suppression regulators coupled to the microelectronic device and configured to provide transient suppression power to the microelectronic device.

16. The microelectronic power regulation system of claim 15, further comprising a plurality of primary power regulators configured to provide independently controlled power to a plurality of portions of the microprocessor.

17. The microelectronic power regulation system of claim 16, wherein at least two of the plurality of primary power regulators are configured to provide power at different voltage levels.

18. The microelectronic power regulation system of claim 15, wherein the microelectronic device includes a plurality of isolated units, wherein each of the plurality of units is coupled to one of the plurality of primary power regulators.

19. A microelectronic power regulation system comprising:
   a controller coupled to a first substrate;
   a first power regulator coupled to the first substrate and the controller, and
   a second regulator coupled to a second substrate, the second substrate adapted for the attachment of a microelectronic device and mechanically coupled to the first substrate.

20. The microelectronic power regulation system of claim 19, wherein the first power regulator forms part of an array of multi-phase switching regulators.

21. The microelectronic power regulation system of claim 19, wherein the second regulator forms part of an array of transient suppression regulators.

22. The microelectronic power regulation system of claim 19, further comprising a sense circuit configured to detect a change in power demanded by a microelectronic device coupled to the sense circuit and to send a signal corresponding to the sensed change in power demand to the controller.

* * * * *